United States Patent [19]

Shirota et al.

[11] Patent Number: 4,677,499
[45] Date of Patent: Jun. 30, 1987

[54] DIGITAL TIME BASE CORRECTOR

[75] Inventors: Norihisa Shirota; Takao Yamazaki; Seiichiro Iwase, all of Kanagawa, Japan

[73] Assignee: Sony Corporation, Tokyo, Japan

[21] Appl. No.: 721,658

[22] Filed: Apr. 10, 1985

[30] Foreign Application Priority Data

Apr. 13, 1984 [JP] Japan ................................. 59-74205

[51] Int. Cl.⁴ .............................................. H03K 5/14
[52] U.S. Cl. .................................. 358/339; 360/36.2; 307/595; 307/602; 371/61; 364/200; 364/900
[58] Field of Search .............. 371/61; 360/36.1, 36.2, 360/38.1; 358/336, 339; 364/200 MS File, 900 MS File; 307/590, 595, 602, 606, 607

[56] References Cited

U.S. PATENT DOCUMENTS

| | | | |
|---|---|---|---|
| 3,675,049 | 7/1972 | Haven | 307/602 |
| 3,851,100 | 11/1974 | Herzog | 360/36.2 X |
| 4,330,846 | 5/1982 | Colles | 360/36.2 X |
| 4,532,556 | 7/1985 | Gundry | 360/36.1 X |
| 4,626,716 | 12/1986 | Miki | 307/590 |

Primary Examiner—Jerry Smith
Assistant Examiner—Robert W. Beausoliel, Jr.
Attorney, Agent, or Firm—Lewis H. Eslinger; Alvin Sinderbrand

[57] ABSTRACT

There is provided a digital time base corrector in which a digital input signal of one block consisting of a continuous data time sequence is converted to a digital signal including data lack intervals or vice versa by a variable delay circuit. A signal selecting circuit is divided into N first unit selecting circuits and a second unit selecting circuit. M of the output signals of a shift register are inputted to the first unit selecting circuits, by which one of them is selected. The outputs of the N first unit selecting circuits are supplied to the second unit selecting circuit, by which one of them is selected. A pipeline process is performed by inserting a delay circuit to delay the signal for the time of one clock period into the input/output line of the second unit selecting circuit. Further, the selecting signal can be made variable for every one clock and a delay circuit is inserted on the output side of a selecting signal forming circuit. With this corrector, the influence of the gate delay of the selectors can be reduced and the high speed data process can be performed.

5 Claims, 17 Drawing Figures

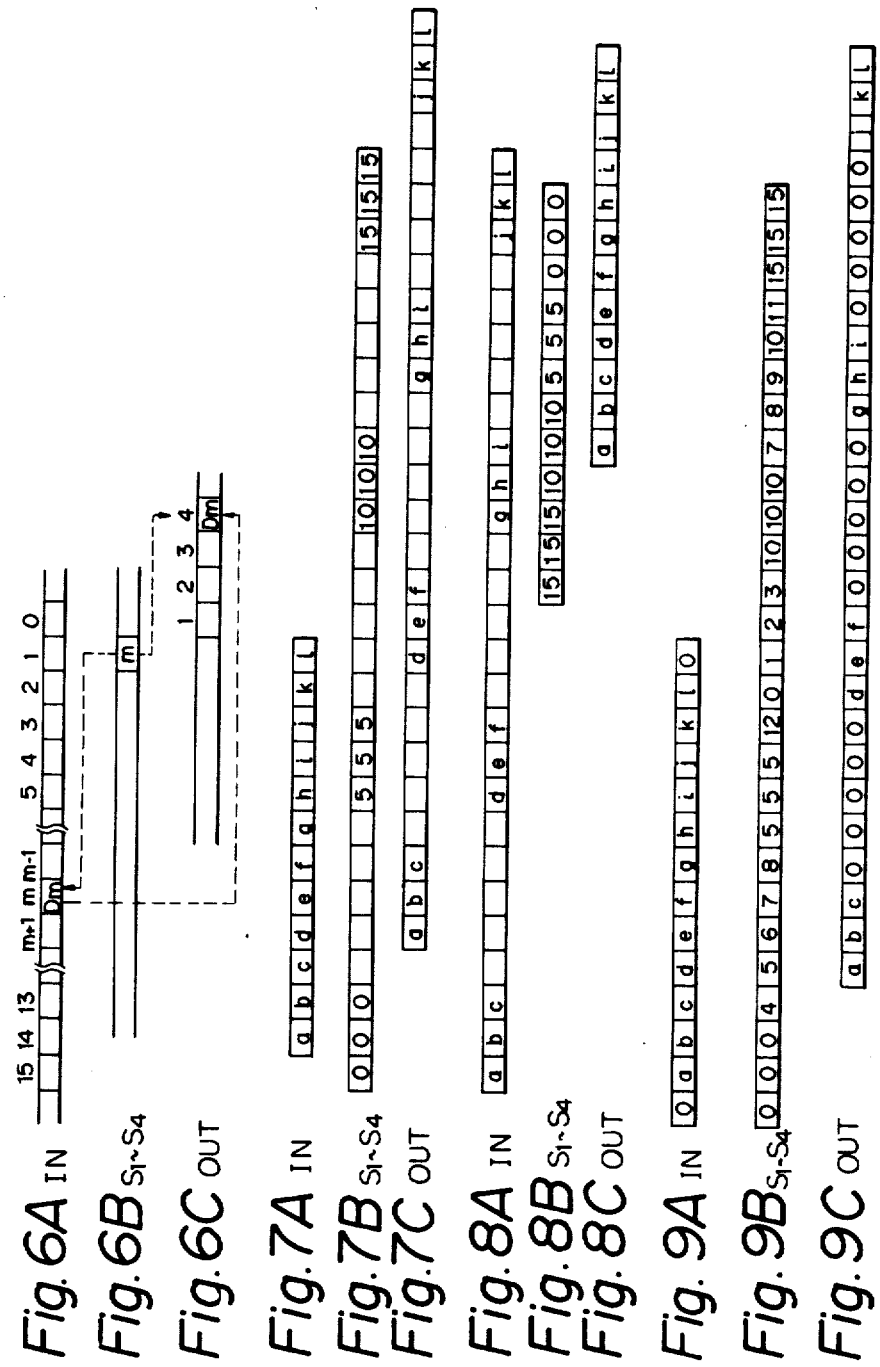

DIGITAL TIME BASE CORRECTOR

BACKGROUND OF THE INVENTION

The present invention relates to a digital time base corrector which is applied to form a data lack interval for addition of redundancy data when, for example, a digital video signal is recorded or contrarily to derive a continuous digital video signal by removing a data lack interval.

This invention intends to realize a time base correction by means of a digital variable delay circuit in which a delay amount can be varied for every clock. As one of conventional digital variable delay circuits, there has been known a delay circuit of the type in which: shift registers having eight stages, four stages, two stages, and one stage are cascade connected between its input and output terminals; a multiplexer to select either one of the data transmitted through the shift register and the data transmitted without passing through this shift register is provided at each connecting point between the shift registers; and a desired delay amount among zero stage, one stage, . . . , and fifteen stages can be set by controlling the multiplexers. Such a conventional variable delay circuit cannot change the delay amount for every clock, so that it is improper as a time base corrector for producing or removing an arbitrary data lack interval.

On one hand, as another example of the conventional delay circuits, there has been known a delay circuit of this type in which, for example, three shift registers each having k stages are cascaded connected and either one of total four data of an output of this cascade connection, an input data, an output of the shift register at the first stage, and an output of the second shift register is selected by a multiplexer. This variable delay circuit cannot form a data lack interval of an arbitrary length on one-clock unit basis, so that there is a drawback.

FIG. 1 shows further another example of the conventional variable delay circuits. An input data is supplied to a shift register 1 in which registers $R_1, R_2, R_3, \ldots, R_{n-1}$, and $R_n$ of n stages are connected in series. n bits which are fetched respectively from between the respective stages of the registers and from an output of the register $R_n$ are supplied to a selector 2. The shift register 1 performs the shifting operation in response to a clock synchronized with the input data. The selector 2 selects one bit from n bits and outputs it. The selection of one bit by the selector 2 is controlled by an output of a decoder 3. Therefore, a desired delay amount can be derived by way of a selecting signal which is supplied to the decoder 3.

The foregoing conventional variable delay circuit has drawbacks such that propagation delay times in the selector 2 and decoder 3 become long with an increase in number n of stages and an arrangement of the selector 2 also becomes complicated. Therefore, in case of a digital video signal whose sampling period is so short as to be 90 nsec, a desired signal cannot be derived in the stable state for every clock.

In addition to this, it is difficult to vary the delay amount to be set for every clock.

Hitherto, the time base corrector has been constituted using a RAM (random access memory) in place of a variable delay circuit. However, to store and read out high speed data such as a digital video signal, it is necessary to use a plurality of, for instance, K RAMs in parallel and thereby to reduce the storing speed into and reading speed from the RAM to 1/K of those in the case where a single RAM is used. In case of producing a data lack interval by making the RAMs operative in parallel and stopping a read counter as described above, there is a problem such that the length of data lack interval can be set only on a K-clock unit basis.

SUMMARY OF THE INVENTION

It is an object of the present invention to provide a digital time base corrector in which even in case of a high speed digital signal such as a digital video signal, a data lack interval having an arbitrary length can be produced or removed on one-clock unit basis.

This invention intends to allow a variable delay circuit to perform a conversion from a digital input signal of one block consisting of a continuous data time sequence into a digital signal including data lack intervals in one block or the conversion opposite thereto.

This variable delay circuit comprises: a shift register to which a digital input signal is supplied and in which a plurality of unit delay stages are connected in series; a selecting signal forming circuit to generate a selecting signal to produce or delete a data lack interval; and a signal selecting circuit to select one of a plurality of output signals having different delay times fetched from the shift register in response to the selecting signal.

In this invention, the signal selecting circuit is divided into N first unit selecting circuits and a second unit selecting circuit. M of those plurality of output signals of the shift register are inputted to the first unit selecting circuits, by which one of the signals is selected. Output signals of the N first unit selecting circuits are supplied to the second unit selecting circuit, by which one of the signals is selected. The pipeline process is performed by inserting a delay circuit to delay a signal for the time of its one clock period into an input/output line of at least the second unit selecting circuit. Further, the selecting signal is made variable for every one clock period and at the same time a delay circuit is inserted on the output side of the selecting signal forming circuit.

The above and other objects, features and advantages of the present invention will be more apparent from the following detailed description in conjunction with the accompanying drawings.

BRIEF DESCRIPTION OF THE DRAWINGS

FIGS. 6A–6C are time charts for use in explanation of the delaying operation in the embodiment of the invention; and FIGS. 7A–7C, 8A–8C, and 9A–9C are time charts for use in explanation of the time base correcting operation in the embodiment of the invention, respectively.

DETAILED DESCRIPTION OF THE PREFERRED EMBODIMENT

Figure 2:
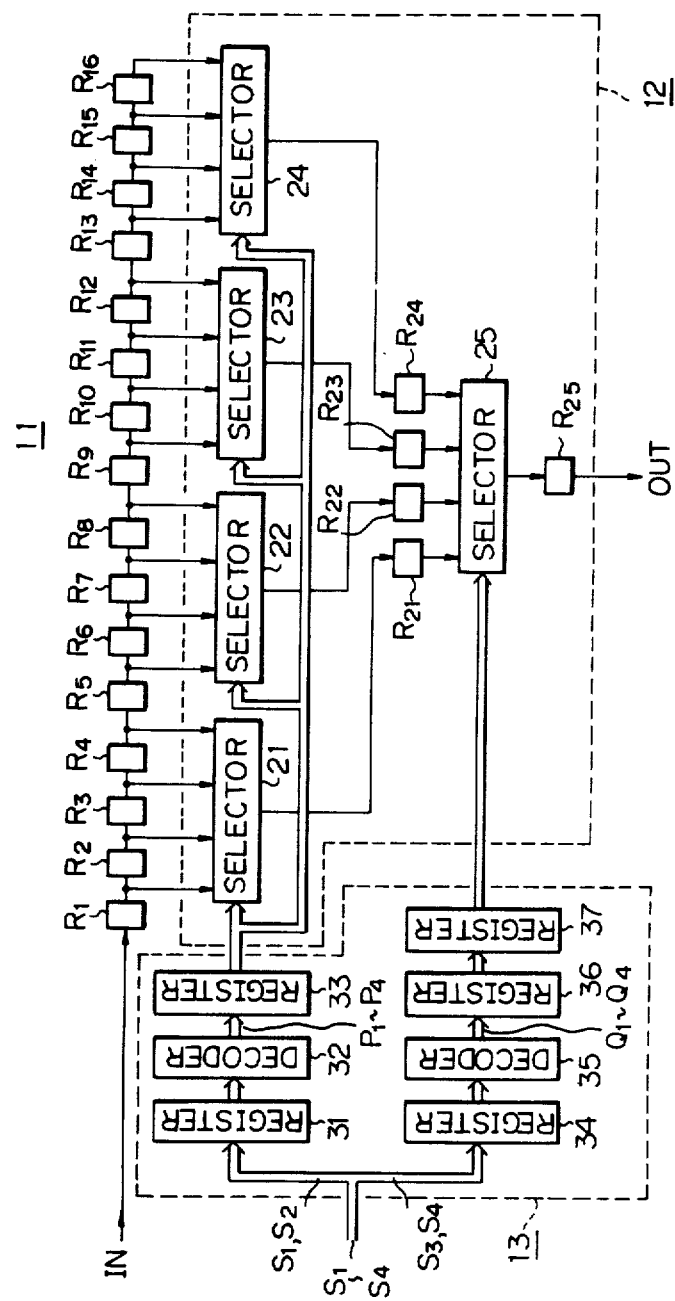
FIG. 2 is a block diagram of one embodiment of the present invention.

One embodiment of the present invention will now be described in detail hereinbelow with reference to the drawings. As shown in FIG. 2, this embodiment is constituted by registers $R_1, R_2, \ldots, R_{15}$, and $R_{16}$ of sixteen stages. The embodiment comprises: a shift register 11 to which a shift pulse (not shown) synchronized with a sampling clock of input data is supplied; a selector block 12 indicated by the section surrounded by a broken line; and a decoder block 13 shown by the section surrounded by a broken line.

The serial input data is supplied to the shift register 11 and sixteen output signals are fetched from between the respective stages of the registers $R_1$ to $R_{16}$ and from the output side of the register $R_{16}$. Every four output signals among those sixteen output signals are supplied to selectors 21, 22, 23, and 24 in the selector block 12, respectively. Practically speaking, the four output signals taken out from between the respective stages of the series connection of the registers $R_1$ to $R_4$ are supplied to the selector 21. The four output signals taken out from between the respective stages of the series connection of the registers $R_5$ to $R_8$ supplied to the selector 22. The four output signals taken out from between the respective stages of the series connection of the registers $R_9$ to $R_{12}$ are supplied to the selector 23. The four output signals fetched from between the respective stages of the series connection of the registers $R_{13}$ to $R_{16}$ and from the register $R_{16}$ are supplied to the selector 24. In this embodiment, it is assumed that $N=4$ and $M=4$. As for a data width, only the data width as much as one bit is shown in this embodiment for simplicity of explanation; however, the shift registers 11 and selector blocks 12 of the numbers which are equal to the number of bits of the data width are arranged in parallel.

Each of the selectors 21 to 24 selects one of the four inputs and then outputs it. Outputs of the selectors 21 to 24 are supplied to registers $R_{21}$, $R_{22}$, $R_{23}$, and $R_{24}$. Respective outputs of the registers $R_{21}$ to $R_{24}$ are supplied to a selector 25. The selector 25 selects one of those four inputs and then outputs it. An output of the selector 25 is supplied to a register $R_{25}$. An output data having a delay of a predetermined clock period for the input is fetched from the register $R_{25}$.

The selecting signal of four bits $S_1$ to $S_4$ is supplied to the decoder block 13. Lower significant two bits $S_1$ and $S_2$ among them are supplied through a register 31 to a decoder 32 and are converted to a selecting signal of four bits $P_1$ to $P_4$. This selecting signal $P_1$ to $P_4$ is supplied to a register 33. Higher significant two bits $S_3$ and $S_4$ of the foregoing selecting signal are supplied through a register 34 to a decoder 35 and are converted to a selecting signal of four bits $Q_1$ to $Q_4$. An output of the decoder 35 is supplied through a register 36 to a register 37. The selectors 21 to 24 are controlled by the selecting signal $P_1$ to $P_4$ from the register 33, while the selector 25 is controlled by the selecting signal $Q_1$ to $Q_4$ from the register 37.

Figure 1:
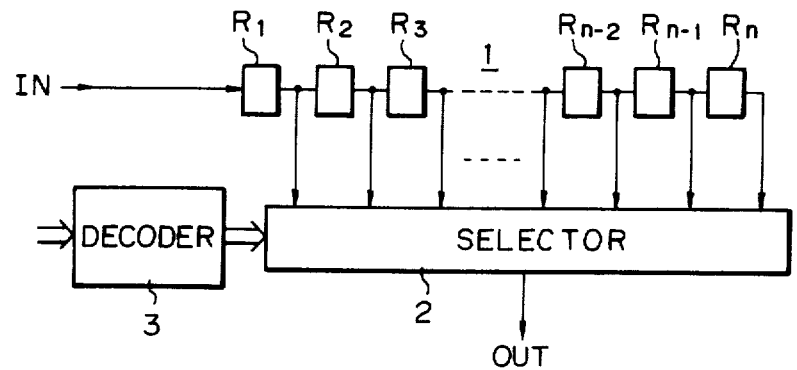
FIG. 1 is a block diagram of a conventional variable delay circuit.
Figure 3:
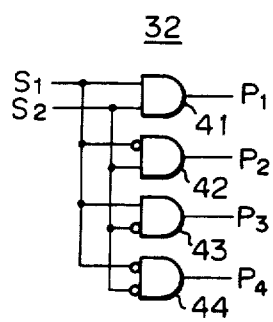
FIG. 3 is a block diagram of one example of a decoder.

FIG. 3 shows an arrangement of one example of the decoder 32. AND gates 41, 42, 43, and 44 are arranged. The two bits $S_1$ and $S_2$ of the selecting signal are supplied to the AND gate 41. The bits $\overline{S_1}$ and $S_2$ are supplied to the AND gate 42. The bits $S_1$ and $\overline{S_2}$ are supplied to the AND gate 43. The bits $\overline{S_1}$ and $\overline{S_2}$ are supplied to the AND gate 44. Therefore, one bit of the selecting signal $P_1$-$P_4$ which is fetched as the output of the decoder 32 is "1" and the other bits are all "0".

Figure 4:
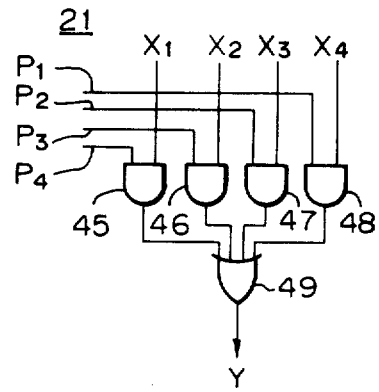
FIG. 4 is a block diagram of one example of a selector.

FIG. 4 shows an arrangement of one example of the selector 21. Outputs $X_1$, $X_2$, $X_3$, and $X_4$ of the registers $R_1$ to $R_4$ of the shift register 11 are supplied to respective one input terminal of four AND gates 45, 46, 47, and 48. The selecting signal $P_1$ to $P_4$ formed by the decoder 32 is supplied from the register 33 to the other input terminals of the AND gates 45 to 48. Outputs of the AND gates 45 to 48 are supplied to an OR gate 49 and an output signal Y is taken out from the OR gate 49. One of the outputs $X_1$ to $X_4$ is taken out as the output signal Y by the selecting signal $P_1$-$P_4$ through one of the four AND gates 45–48.

Although not shown, the decoder 35 has an arrangement similar to that shown in FIG. 3. Although not shown, each of the selectors 22 to 25 has an arrangement similar to that shown in FIG. 4. The output signal of the shift register 11 selected in response to the lower significant two bits $S_1$ and $S_2$ of the selecting signal is fetched from the selectors 21 to 24. On one hand, one of the output signals of the selectors 21-24 is selected by the selector 25 in response to the higher significant two bits $S_3$ and $S_4$ of the selecting signal, namely, the selecting signal $Q_1$-$Q_4$ formed by the decoder 35. Therefore, one of the sixteen output signals from the shift register 11 corresponding to the selecting signal $S_1$ to $S_4$ is taken out as the output signal.

Figure 5:
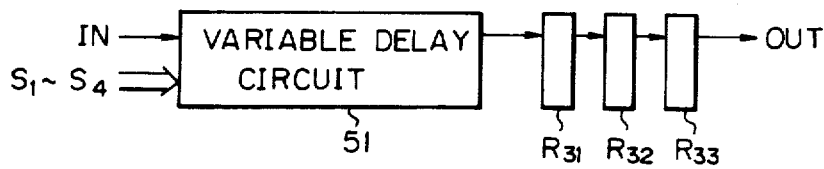
FIG. 5 is a block diagram showing an equivalent arrangement of the embodiment of the invention.

When all of the bits $S_1$ to $S_4$ of the selecting signal are "0", the input data is fetched along the path from the register $R_1$ through the selector 21, register $R_{21}$ and selector 25 to the register $R_{25}$, so that the register having the minimum delay amount of three stages is presented. When the bits $S_1$-$S_4$ of the selecting signal are all "1", the input data is taken out along the path from the registers $R_1$-$R_{16}$ of the shift register 11 through the selector 24, register $R_{24}$ and selector 25 to the register $R_{25}$, so that the register having the maximum delay amount of eighteen stages is presented. A predetermined delay amount within the range from three stages to eighteen stages is set due to the selecting signal $S_1$ to $S_4$. Namely, as shown in FIG. 5, this embodiment is equivalent to the arrangement in which registers $R_{31}$, $R_{32}$ and $R_{33}$ of three stages are connected to a variable delay circuit 51 whose delay amount is varied within the range from 0 to 15 stages. In the digital signal process having no feedback loop such as a digital video signal process or the like, the fixed delay amount of about ten stages does not cause any problem in particular and no inconvenience will be caused even if the minimum delay amount is three stages.

In this embodiment, the registers are provided on the input and output sides of the respective selectors 21 to 25, while the registers are arranged on the input and output sides of the respective decoders 32 and 35. A reason why the registers 36 and 37 of two stages instead of one stage are connected on the output side of the decoder 35 is to compensate the time lag which is caused in the registers $R_{21}$ to $R_{24}$. Such a pipeline process makes it possible to reduce the influence of the gate delays in the selector block 12 and decoder block 13. Also, even in high speed data such as a digital video signal, the delay amount can be selected for every clock.

In addition, the number of stages of the shift register, the number of inputs of the selector, the number of selectors, the number of stages of the selectors with a tree-like arrangement, etc. can be set to other various values than the values in the foregoing embodiment.

The input/output relation of data in the foregoing embodiment will then be described with reference to FIGS. 6A–6C. FIG. 6A shows a time sequence having continuous input data. The data is sequentially stored into the shift register 11 in accordance with the inputting order. As shown in FIG. 6B, when the selecting signal $S_1-S_4$ is inputted, the time sequence goes back to the past by only its value (m in case of the drawing shown) and the corresponding time is selected. Assuming that the content of the register corresponding to this selected time is $D_m$, the output which is generated four clocks after the time when the selecting signal was supplied becomes $D_m$ as shown in FIG. 6C. This delay of four clocks is caused due to the pipeline process.

The operation when forming the data lack intervals will be explained with reference to FIGS. 7A-7C. FIG. 7A shows the input data in which one block consists of continuous twelve data a, b, c, ..., l. For this input data, as shown in FIG. 7B, the value "0" of the selecting signal $S_1-S_4$ is made continuous for the interval of three clocks; then the interval of five clocks is interposed and the value "5" of the selecting signal is made continuous for the interval of three clocks; further, the value "10" of the selecting signal continues for the interval of three clocks after the interval of next five clocks; and subsequently, the value "15" of the selecting signal continues for the interval of three clocks after the interval of next five clocks. In FIG. 7B, arbitrary values are set for each interval of five clocks where the value of the selecting signal $S_1-S_4$ is not designated.

As described above, when the selecting signal $S_1-S_4$ is varied, as shown in FIG. 7C, the output data is generated at the timing which was delayed by four clocks with respect to the selecting signal. This output data is constituted in a manner such that the twelve input data are grouped to every three data and the data lack interval having the length corresponding to the five data is interposed between those groups each consisting of three input data, respectively. In FIG. 7B, by making the value of the selecting signal for each 5-clock interval coincide with that for each previous 3-clock interval, the output data is changed such as a b c d e f g h d e f g h i j k .... Therefore, in FIG. 7C, the output data for each 5-clock interval where no data is written does not become zero. However, the data for this interval is inherently unnecessary and may be substituted by redundancy data or the like such as error correction codes; therefore, this interval substantially becomes the data lack interval.

FIG. 8A shows the data having data lack interval similar to those shown in FIG. 7C. This data is supplied as the input data to the shift register 11 and the value of the selecting signal $S_1-S_4$ is decreased from "15" to "0" on a five-unit basis for every 3-clock interval at timings shown in FIG. 8B. The first value "15" of the selecting signal is caused after the interval of fifteen clocks from the first one of the input data.

As shown in FIG. 8C, the output data is generated after the interval of four clocks from the change of the selecting signal $S_1-S_4$ shown in FIG. 8B. The sequence of this output data is such that twelve data of one block are continuous without including a data lack interval. This data lack interval among the input data (FIG. 8A) upon time base compression is not limited to the time slot where no data exists but may be the interval where arbitrary data exists.

Predetermined symbols, e.g., all "0" may be also inserted into the data lack intervals which are caused upon time base expansion. Namely, as shown in FIG. 9A, data "zero" is respectively added in front of the first data and behind the last data among the twelve data of one block to produce the new input data. Then, as shown in FIG. 9B, the selecting signal $S_1-S_4$ is varied.

Similarly to the case of FIG. 7B, this selecting signal forms the data lack interval corresponding to the 5-clock interval for every three data and in this data lack interval, the data "zero" added to the first or last portion of one block is selected. Therefore, all of the data lack intervals among the output data become "0" as shown in FIG. 9C. The symbols which are inserted into these data lack intervals may be all "1" instead of "0".

According to the present invention, by use of a variable delay circuit which can vary the delay amount for every one clock, the data lack interval having an arbitrary length can be formed at an arbitrary location in the input signal sequence, or contrarily the data lack interval of an arbitrary length which is located at an arbitrary position can be removed from the input signal sequence. In this invention, the selectors are arranged like a tree and also the pipeline process is performed for the selectors, thereby making it possible to realize a digital time base corrector which can reduce the influence of the gate delay of the selectors and data can be processed at a high speed.

The present invention is not limited to the foregoing embodiment but many modifications and variations are possible within the spirit and scope of the appended claims of the invention.

What is claimed is:

1. A digital time base corrector for correcting the time base of a serial input digital information signal with a predetermined clock frequency comprising:
   (A) a delay circuit supplied with said serial input digital information signal and for generating a plurality of delayed outputs therefrom, each having different respective time delays;
   (B) a first group of selecting circuits, each of which is supplied with M of said delayed outputs as inputs thereof and for selecting one of said inputs, wherein M is a positive integer;
   (C) a plurality of unit delay circuits, each of said delay circuits being connected to the output of a respective one of said selecting circuits and for delaying the output signal of said selecting circuit for one clock period;
   (D) a second selecting circuit supplied with the outputs of said unit delay circuits and for selecting one of said outputs;
   (E) a selecting signal generating circuit supplied with a digital selecting signal that determines an extent of time base correction to be applied to said input digital signal and which is varied at every clock period for generating first and second selecting signals; and
   (F) first and second register means connected respectively to said first and second selecting signals of said selecting signal generator and for delaying said first and second selecting signals, respectively, the output of said first register means being supplied to said first group of selecting circuits and the output of said second register means being supplied to said second selecting circuit.

2. A digital time base corrector according to claim 1, wherein said first register means delays said first selecting signal for one clock period and said second register means delays said second selecting signal for two clock periods.

3. A digital time base corrector according to claim 2, wherein said delay circuit includes a plurality of registers and each of said plurality of outputs is obtained at the output of each of said registers.

4. A digital time base corrector according to claim 1, wherein said selecting signal generating circuit includes first and second decoders for generating said first and second selecting signals, respectively, lower bits of said digital selecting signal being supplied to said first decoder and higher bits of said digital selecting signal being supplied to said second decoder.

5. A digital time base corrector according to claim 1, wherein said input digital signal is a serial data sequence in one block and the output of said second selecting circuit has a data blanking period in said one block.

* * * * *